United States Patent
Lu et al.

(10) Patent No.: US 6,215,697 B1
(45) Date of Patent: Apr. 10, 2001

(54) MULTI-LEVEL MEMORY CELL DEVICE AND METHOD FOR SELF-CONVERGED PROGRAMMING

(75) Inventors: Tao Cheng Lu, Kaohsiung; Der Shin Shyu, Hsinchu; Shi Xian Chen, Yualin Town; Wen Jer Tsai; Mam Tsung Wang, both of Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/231,044

(22) Filed: Jan. 14, 1999

(51) Int. Cl.[7] .................................................. G11C 16/04

(52) U.S. Cl. ............................. 365/185.03; 365/185.2; 365/189.09

(58) Field of Search ........................... 365/185.03, 185.1, 365/185.2, 185.24, 185.26, 185.09, 196, 207

(56) References Cited

U.S. PATENT DOCUMENTS

| 584,739 | * | 11/1997 | Takeuchi | 365/185.03 |
|---|---|---|---|---|
| 5,550,772 | * | 8/1996 | Gill | 365/185.03 |
| 5,600,593 | * | 2/1997 | Fong | 365/185.19 |
| 5,623,442 | * | 4/1997 | Gotou et al. | 365/185.08 |
| 5,712,815 | | 1/1998 | Bill et al. | 365/185.03 |

OTHER PUBLICATIONS

Bauer, M. et al., "TA 7.7: A Multilevel–Cell 32Mb Flash Memory", 1995 IEEE International Solid–State Circuits Conference, Digest of Technical Paper, IEEE, Feb. 1995, pp. 132–133.

Choi, Y–J. et al., "A High Speed Programming Scheme for Multi–Level NAND Flash Memory", 196 Symposium on VLSI Circuits, Digest of Technical Papers, IEEE, Jun. 1996, pp. 170–171.

* cited by examiner

*Primary Examiner*—David Nelms
*Assistant Examiner*—Thong Le
(74) *Attorney, Agent, or Firm*—Mark A. Haynes; Haynes & Beffel LLP

(57) ABSTRACT

A multi-level memory cell device and method for self-converged programming which includes a memory cell switchably coupled to a non-programmable reference cell (or dummy cell), the cells arranged in respective arrays. A current source voltage between the source node and ground of the cells is relational to the threshold voltage, so as the threshold voltage is increased, the current source voltage decreases. The threshold voltage of the dummy cell is set by a stable voltage source. The memory cell is programmed and the current source voltage of the memory cell is compared to the current source voltage of the reference cell and therefore the difference in the voltages can be used to sense convergence of the programmed cell with a target threshold level set on the reference cell. A controller is also included between the reference cell and memory cell for adjusting the threshold voltage of the dummy cell according to the gate coupling ratio of the floating gate memory cell. The controller is also used to adjust voltages for both programming and read operations. The voltage difference resulting from the sources of the memory cell and reference cell is used to provide program control signals and thereby cease programming of the memory cell when convergence has been reached.

25 Claims, 8 Drawing Sheets

Loading Effect

MULTI-LEVEL MEMORY CELL DEVICE AND METHOD FOR SELF-CONVERGED PROGRAMMING

BACKGROUND OF THE INVENTION

1. Field of the Invention

The present invention relates to memory cell devices, and more particularly to a non-volatile memory cell device and method which provides for improved self-converged programming of multiple bit levels.

2. Description of Related Art

Non-volatile memory cells are used to store bits of information which comprise digital words and the like. Such memory cells include floating gate transistor devices which have a drain, source, and gate nodes. The gate includes a control gate for application of a voltage, and a floating gate which floats in a layer of material between the device substrate and control gate. Voltages are applied across the nodes in such a way as to induce current flow through the device and cause hot electrons to jump over to the floating gate. The bits of information are therefore stored as a charge or voltage level on the floating gate of the cell, and the charge will remain until the cell is erased or reprogrammed. In the past, memory cells have commonly been used to store two levels of information, e.g. high for "1" or "on," and low for "0" or "off." These on and off states are arranged in collected memory cells to comprise binary strings of information which are used by computers and digital processing devices.

Memory cells have also been used to store multiple levels of data on an individual cell. Instead of two states (on or off), a series of levels can be programmed into the memory cell and then read back as multiple states. For instance three levels will provide four data bits for a single cell (e.g. zero plus three distinct voltage levels). Accordingly, this will provide higher storage densities for a given number (or array) of memory cells. Multi-level programming of devices such as flash EEPROMs (electronically erasable programmable read only memories) will allow for increased storage capacity without increasing the die size used to form the overall device. The end result is a reduced cost per bit.

For realizing multi-level programming, accurate control of the amount of charge placed on the floating gate of a memory cell is important. Many different programming methods have been previously proposed to control the amount of charged stored on the floating gate, such as program-and-verify and self-convergence methods. The program-and-verify method is widely used and involves programming the memory cell in a ramped or step-wise fashion via a programming pulse. After each programming step is applied, a verification step is performed to confirm whether the desired level on the memory cell has been achieved. Problems inherent with this method include slow programming speed, as each programming and verification step takes a certain amount of time to perform. In addition, a very stable pulse control is necessary to prevent overshoot of each programming level. Examples of modern program-and-verify methods include: M. Bauer et al., "A Multilevel-Cell 32 Mb Flash Memory," IEEE ISSCC Digest of Technical Papers, pp. 132–133, 1995; and Y. Choi et al., "A High Speed Programming Scheme For Multi-Level NAND Flash Memory," Symp. on VLSI Circuits Digest of Technical Papers, pp. 170–171, 1996.

Accordingly, self-convergence methods provide advantages regarding programming speed and pulse control requirements. In general, the memory cell is programmed by connecting the drain node to a dataline, the gate node to certain voltage, and the source node to a current source or ground (hence the line is also referred to as a source line). Note also that drain side sensing configurations can also be used. When a memory cell is programmed to a higher target threshold voltage (Vt), the voltage at the current source (Vs) will become proportionally lower to keep relatively the same programming current through the memory cell. Thus, Vt and Vs of the memory cell have a one-to-one correlation. By monitoring Vs, the corresponding Vt can be achieved through this correlation. One method employing this effect is described in U.S. Pat. No. 5,712,815 (see FIG. 1 in detailed description). Three reference voltages are used to define memory cells with four different levels. The current source voltage Vs is compared to the desired reference voltage Vref, and when Vs drops below Vref, then the programming will stop automatically. An array of reference memory cells is also provided which are programmable to different reference levels. It has been found that for read operations, a voltage margin is needed above the target voltage level to compensate for possible drops that might occur as a result of the read. The differently programmed reference cells provide this read margin.

Improved memory cell devices and programming methods are required, however, to achieve a tighter distribution of read current and programming levels in light of such detrimental things including loading effects, process variations, temperature variations, and supply voltage variations. A tighter distribution will provide the benefit of even more levels being made available for multiple bits from a single cell.

SUMMARY OF THE INVENTION

The present invention provides an improved memory cell device and method for self-converged programming of a multi-levels on an individual memory cell. As a memory cell is programmed upwards to a target voltage level, the voltage across a current source (Vs) coupled to the source node (or source line) will decrease proportionally in order to keep the programming current through the cell the same. Hence by tracking the Vs associated with the memory cell, a target threshold voltage (Vt) level can be achieved via programming. A reference cell, which can easily be configured to be non-programmable dummy cell, is also associated with the memory cell and shares the same wordline and dataline voltages during programming. The threshold voltages of the dummy cells are controlled by voltages coming from a stable voltage regulator. When the reference cell is configured to be non-programmable, then the Vs of the dummy cell is fixed during programming. By comparing the Vs of the memory cell and the dummy cell, the converged threshold voltage of the memory cell will be the same as the threshold voltage of the dummy cell if their gate coupling ratios (GCRs) are equal. The term GCR applies to a floating gate cell and is the ratio of charge which ends up on the floating gate from a charge applied to the control gate due to coupling effects between the two gates. A GCR and threshold voltage (Vt) controller is provided between the memory cell and the dummy cell in order to adjust the threshold voltage apparent on the dummy cell, and hence the Vs coming from the dummy cell. By comparing the Vs of the memory cell to a reference voltage which represents the Vs of a dummy cell (instead of a constant voltage as proposed by the prior art), a tighter distribution of read current can be obtained.

While individual cells have been discussed for representative purposes, in practice the memory cells and dummy cells will exist as part of respective arrays of cells arranged in rows and columns. Each memory cell and respective dummy cell will share a common wordline and be coupled to corresponding datalines. The memory cell to be programmed (and the corresponding dummy cell) are selected via a wordline decoder (for the row) and the datalines, or bitlines (for the column). The result of the comparison of the current source voltages will be used to drive a program controller and stop programming if the memory cell voltage level has converged to a target level, which has generally been set to be the threshold voltage of the dummy cell.

Therefore according to one aspect of the present invention, a memory cell device and programming method are provided wherein the current source voltage (Vs1) of a memory cell is compared with the current source voltage (Vs2) of an associated non-programmable dummy cell having a threshold voltage set to a target voltage for the memory cell. When current source voltages are approximately equal, the memory cell voltage level has converged to the target level. The comparison signal is used to direct a program controller to cease programming operations.

According to another aspect of the present invention, a memory cell device and programming method are provided which uses floating gate cells and wherein the gate coupling ratio (GCR) is adjusted via a controller placed between the memory cell and dummy cell.

According to yet another aspect of the present invention, the memory cells and dummy cells are arranged in arrays with rows and columns of respective cells, the cells being selected via common wordlines and datalines, and the source lines (coming from the source node) connected via pass gates to a comparator.

According to still another aspect of the present invention, a memory cell device and programming method are provided wherein the threshold voltages applied to the dummy cells are adjusted to provide adequate read margins.

According to still another aspect of the present invention, a memory cell device and programming method are provided wherein loading effects are eliminated as the current source voltage of the dummy cell varies according to the loading effect.

According to still another aspect of the present invention, a memory cell device and programming method are provided wherein process variations are minimized as the dummy array and memory array are formed near each other, and the same wordline of the memory array and dummy array is selected during programming and read operations.

According to still another aspect of the present invention, a memory cell device and programming method are provided wherein variations on wordline voltage will have minimal effect of the final programmed level on the memory cell, as the converged target voltage on the memory cell is dependant on the threshold voltage of the dummy cell. The threshold voltage of the dummy cell is independent of the wordline voltage which may vary with the power supply.

According to still another aspect of the present invention, a memory cell device and programming method are provided wherein temperature effects can be minimized, as the converged target voltage is independent of temperature if the threshold voltage of the dummy cell is controlled by a stable voltage regulator.

Other aspects and advantages of the present invention can be seen upon review of the figures, the detailed description, and the claims which follow.

DETAILED DESCRIPTION

The present invention provides a memory cell device and self-converged programming method which compares the source line (or source node) voltage of the programmed memory cell to the source line voltage of an associated reference cell. The reference cell is configured to be non-programmable, or hence a dummy cell. The device configuration and programming method serve to reduce loading effects, and to minimize the effect of process variations, wordline voltage variations, and temperature variations which might adversely affect and widen the distribution of the self-converged programming result. A detailed description of the preferred embodiment of the present invention is provided with respect to the Figures.

Figure 1:
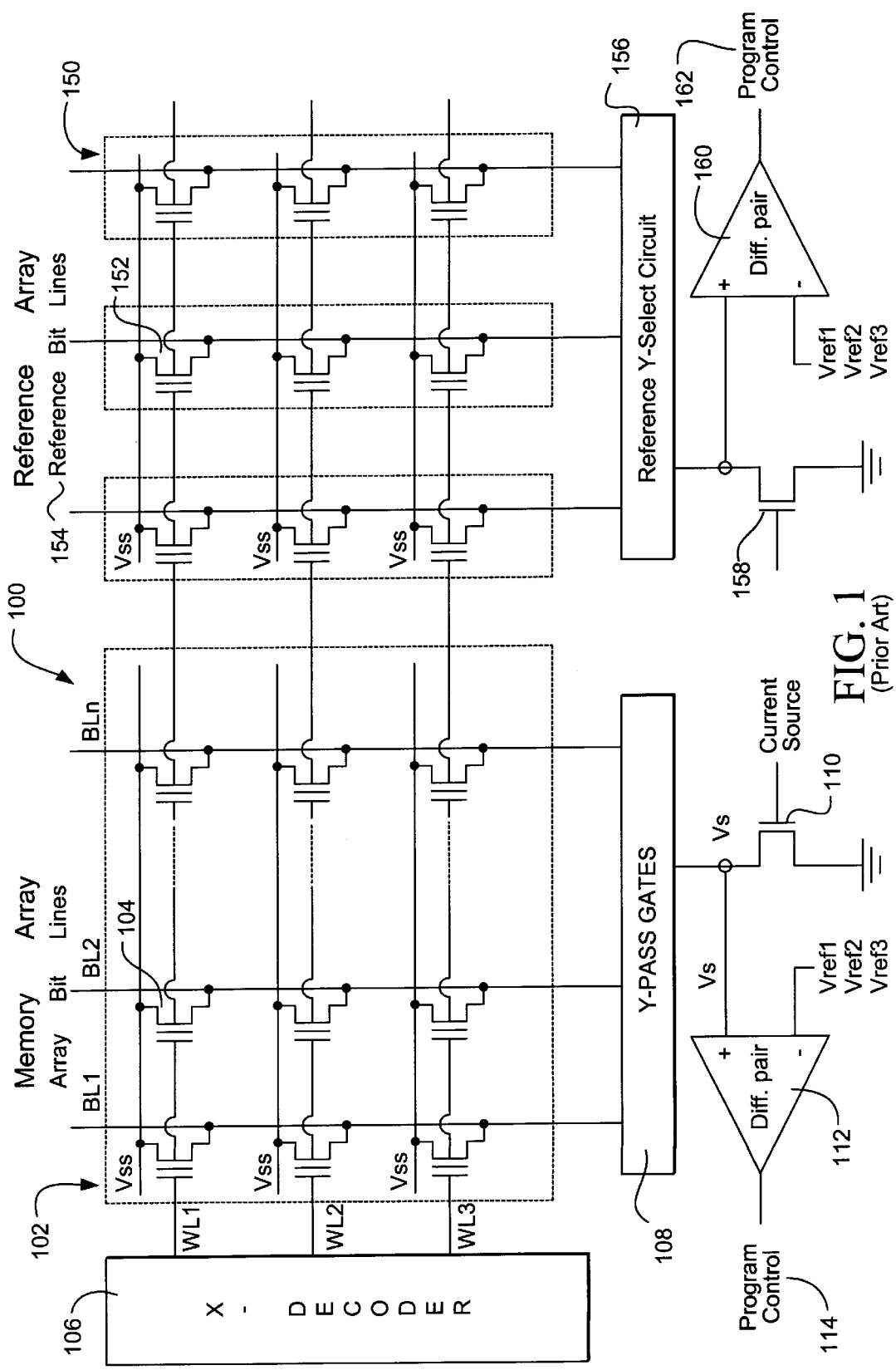
FIG. 1 is a circuit diagram showing a prior art device configuration for self-converged programming of a memory cell which compares the source voltage of the memory cell to a constant voltage reference.

FIG. 1 shows a circuit diagram of a prior art device 100 for self-converged programming of 4 bit levels on an individual memory cell. The device configuration includes a memory array 102 of representative memory cells 104 which are arranged in columns and rows. The column of the memory cell to be programmed is selected by array bit lines BL1–BLn. A decoder 106 is connected across the wordlines WL1, WL2, and WL3 for selecting a particular row. A corresponding reference array 150 of respective reference cells 152 is also shown. The reference array 150 includes reference bit lines 154 for selecting the reference cell column, and the wordlines are shared with those of the memory cells. A pass gate 108 is used to selectively tie the drain nodes of the memory cells to a current source device 110. The resulting current source voltage Vs is used as one input to a comparator 112. The other input is supplied as one of three reference voltages Vref1, Vref2, or Vref3 from a generator source. The reference voltage Vrefn is compared to the current source voltage Vs, and as the programming level increases on the memory cell, the source voltage Vs decreases proportionally. When the difference of the two voltages (Vs and Vrefn) reaches a certain level, then a program control signal 114 is generated to cease further programming of the memory cell. The reference array 150 is also programmed to different reference levels, which are used during read operations. A Y-pass gate 156 is used to selectively couple the drain nodes of the reference cells to a second current source 158, and to one input of a second voltage comparator 160. This differential output 162 is similarly used to invoke programming control inputs. As shown, this device configuration relies on constant voltage sources to provide a comparison point for achieving convergence. Such constant sources are not readily capable of providing compensation for loading effects, temperature variations, wordline voltage variations, or process variations.

Figure 2:
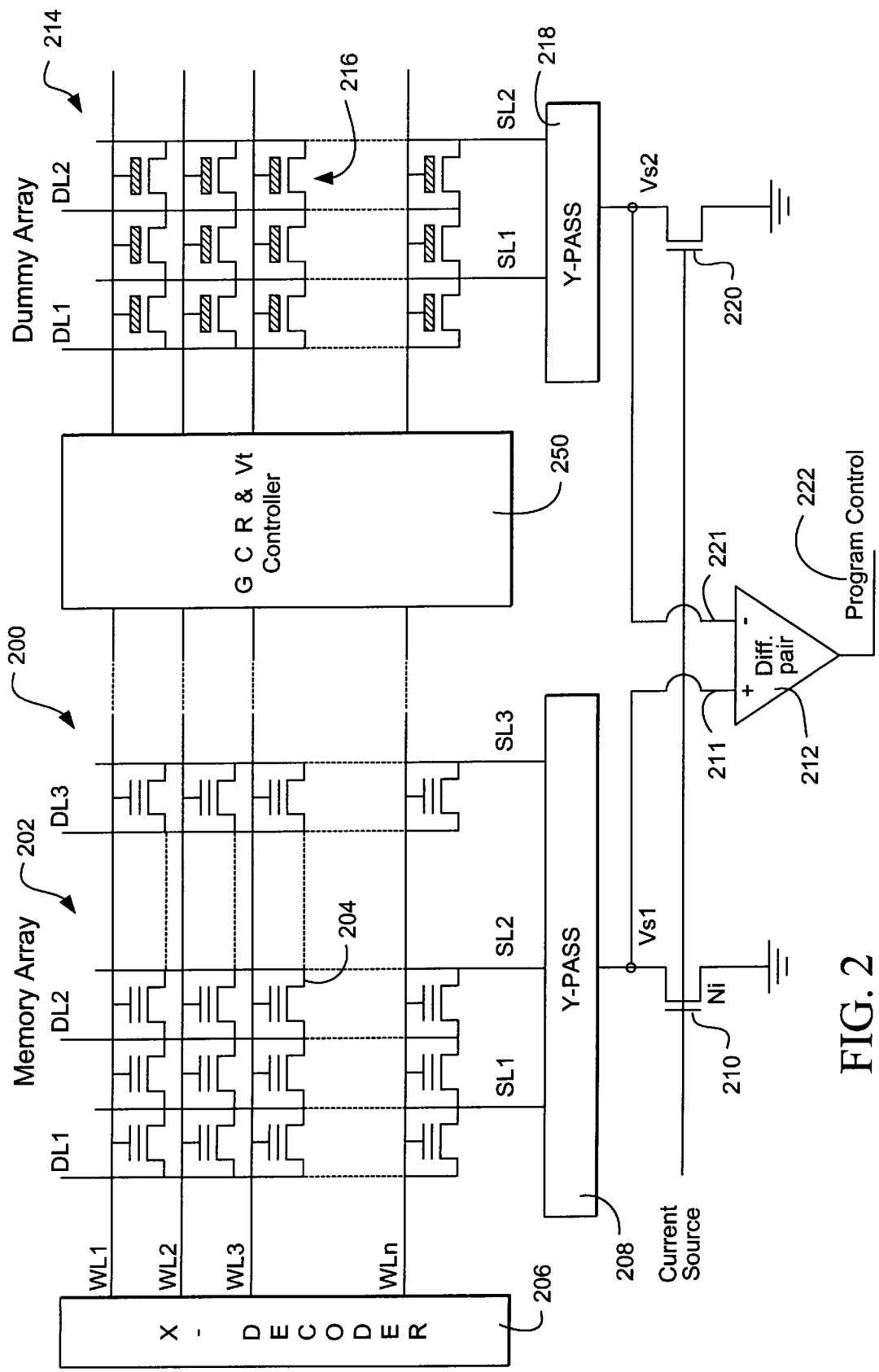
FIG. 2 is a circuit diagram showing the device configuration of the present invention which compares the source voltage of the memory cell with the source voltage of an associated dummy cell.

Referring now to FIG. 2, a circuit diagram is shown of the present memory cell device 200 as used for implementation of a self-converged programming method. A memory cell array 202 is shown which has individual memory cells 204 arranged in columns and rows. Example datalines DL1, DL2, and DL3 are used to select the column of the memory cell to be programmed. A X-decoder device 206 is coupled to wordlines WL1 through WLn for selecting the row of the memory cell. Source lines (source nodes) SL1, SL2, and SL3 are coupled together into a Y-pass gate 208 which selectively couples the active source line to a current sourcing device 210. In this instance, the device 210 includes an NMOS transistor with a known voltage applied to the gate node for producing a known current through the transistor and pulling down the source. The NMOS transistor might also be replaced by a resistor, or other current sourcing device. The resulting current source voltage Vs1 is used as one input 211 to a comparator device 212.

A reference or dummy array 214 is also provided which includes a collection of reference cells 216 arranged in columns and rows. In this instance, the reference cells are configured to be non-programmable and are hence referred to as dummy cells. A set of datalines, for example DL1 and DL2, are used for selecting the dummy cell column, and the wordlines of the dummy cell are commonly shared with the wordlines of the memory cells. The source lines SL1, SL2 are connected via a Y-pass gate 218 which selectively couples the source nodes of the selected dummy cell to a current sourcing device 220 for pulling down the device. During programming, the dataline voltage of the programmed cell is biased at, for example, 4–7 volts, and the wordline is biased at 6–12 volts, with the source line connected to ground through the current source 210. The dummy cell current source voltage Vs2 is used as the second input 221 to the voltage comparator 212. As the voltages Vs1 and Vs2 approach equal values, the voltage level of the memory cell is converging to a target value set as the threshold level of the dummy cell. Upon convergence, a program control signal 222 is generated which is thereafter used to cause the programming of the memory cell to cease.

FIG. 2 also shows a gate coupling ratio (GCR) and threshold voltage (Vt) controller 250 located between the memory cell array 202 and dummy cell array 214. As each floating gate memory cell is formed, a gate coupling ratio limits the amount of charge which eventually gets applied from the control gate to the floating gate. This controller serves to set and adjust the threshold voltage for the dummy cell, for instance a set of voltages Vt1, Vt2, or Vt3 for the 4 bit level device shown. If the GCR of the dummy cell is made equal (or approximately so) to the memory cell, then the converged voltage of the memory cell is dependant upon the Vt of the dummy cell The threshold voltage of the dummy cell will therefore be set (and adjusted as appropriate according to the GCR) to the desired target voltage of the programmed memory cell. Relatedly, the current source voltage of the dummy cell will be adjusted to produce accurate convergence of the programmable memory cell to the desired target levels. As the following description also represents a generalized multi-level device, more bit levels N can be used to achieve even higher bit densities, and as such would require corresponding N−1 threshold voltages from the Vt Controller 250.

Figure 3A:
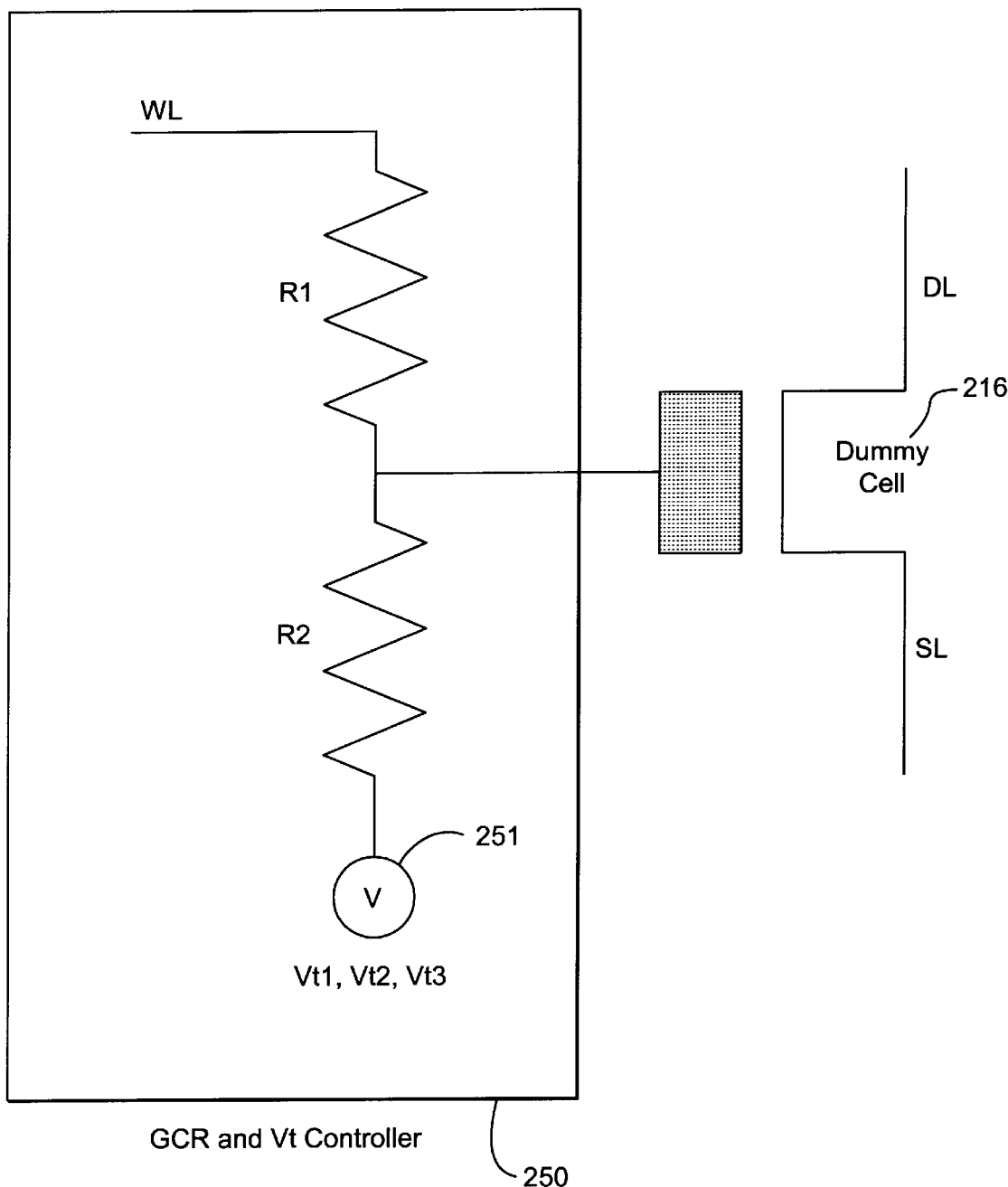
FIG. 3(a) is a circuit diagram showing the gate coupling ratio (GCR) and threshold voltage (Vt) controller which is applied between the memory cell and dummy cell.
Figure 3B:
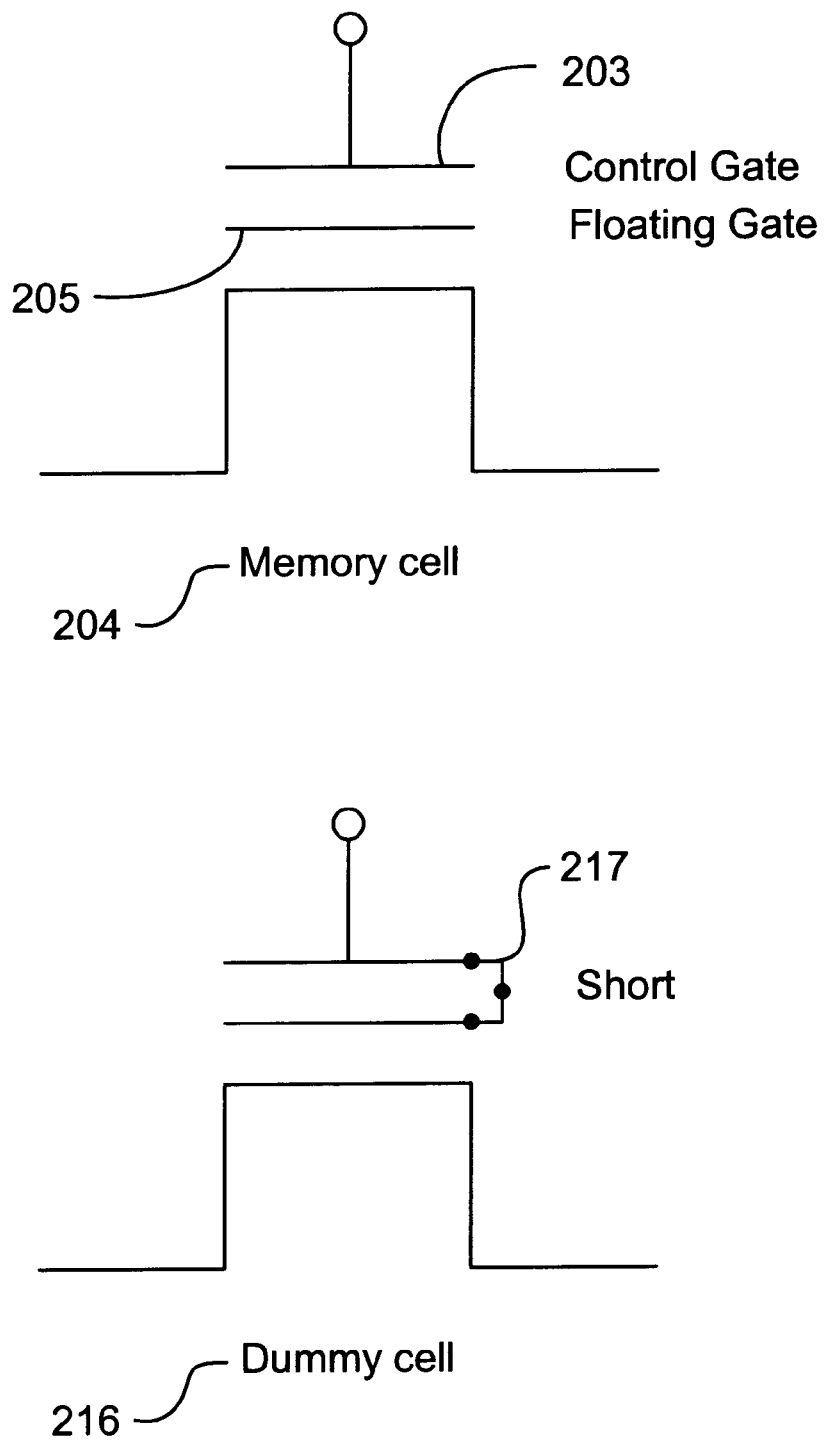
FIG. 3(b) is a diagram showing the formation of a non-programmable dummy cell from a floating gate device.

Referring now to FIGS. 3(a) and 3(b), a diagram is shown of example elements composing the GCR and Vt controller 250. FIG. 3(b) shows a representative memory cell 204 (as per elements in FIG. 2) along with a representative reference (or dummy) cell 216. The memory cell 204 is shown comprised of a floating gate memory cell having a control gate 203 and floating gate 205. The dummy cell 216 is rendered non-programmable by shorting the control gate and floating gate into a common gate 217. The current source voltage of the dummy cell therefore remains fixed during programming because the dummy cell is non-programmable. In FIG. 3(a), the controller 250 includes a voltage divider circuit having resistor R1 and R2 arranged in series for dividing the amount of threshold voltage Vt1, Vt2, or Vt3 applied to the dummy cell. Such resistors might include variable devices or the like. The threshold voltages of the dummy cells are controlled by Vt1, Vt2, and Vt3. The threshold voltages are preferably generated by a voltage supply device 251, such as a stable voltage regulator, and more specifically a device such as bandgap reference voltage generator.

Figure 4:
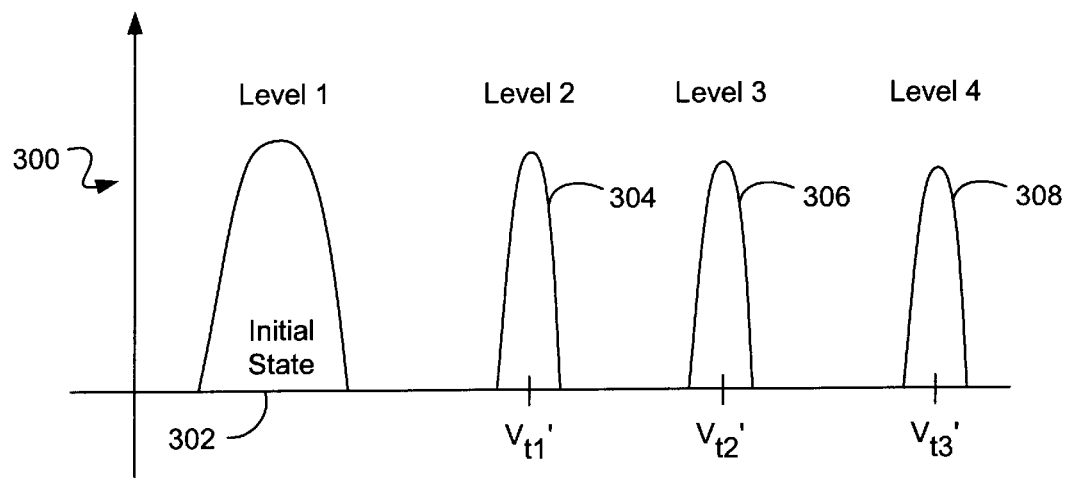
FIG. 4 is a diagram showing states of the adjusted threshold voltage for example levels 1 through 4.

Referring now to FIG. 4, a plot 300 is shown of the voltage states for the example 4 bit levels. An initial state 302 serves as level 1, and subsequent levels 304, 306, and 308 serve as levels 2, 3, and 4. Therefore, the real threshold voltages of the dummy cell combined with the GCR and Vt controller become Vt1', Vt2', and Vt3'. The memory cells will thus converge to Vt1', Vt2' or Vt3' for level 2, level 3, or level 4 as shown in FIG. 4.

Figure 5:
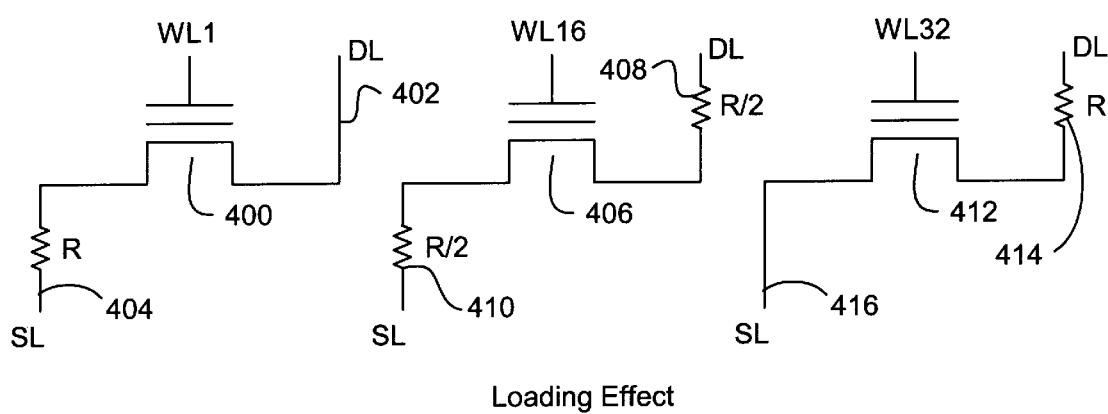
FIG. 5 is a circuit diagram showing the loading effect for different selected wordlines of cells.

One advantage of the proposed memory cell device configuration and self-converged programming method includes a reduced or eliminated loading effect. If the bitlines of the memory array are formed via, for instance, buried diffusions or the like, the loadings of memory cells at different wordlines will be different. For example, referring now to FIG. 5, the loading effect is shown for cells coupled to wordlines WL1, WL16, and WL32. For the cell 400 selected via WL1, the dataline (drain node) 402 has zero resistance loading and the source line (source node) 404 has a resistance loading of R. For the cell 406 selected via WL16, the dataline 408 has a resistance loading of R/2 and the source line 410 has a resistance loading of R/2. For the cell 412 selected via WL32, the dataline 414 has a resistance loading of R and the source line 416 has a resistance loading of zero. Generally speaking, the loading effect will modify the converged voltage for conventional programming methods. In the present invention, the current source voltage Vs2 of the dummy array (or selected dummy cell therein) is not a constant. Instead Vs2 varies in an advantageous manner according to the loading effect because the same wordline of the dummy cell is selected for both programming and read operations. As a result, converged threshold voltages Vt1', Vt2', and Vt3' are not changed by the loading effect.

Figure 6:
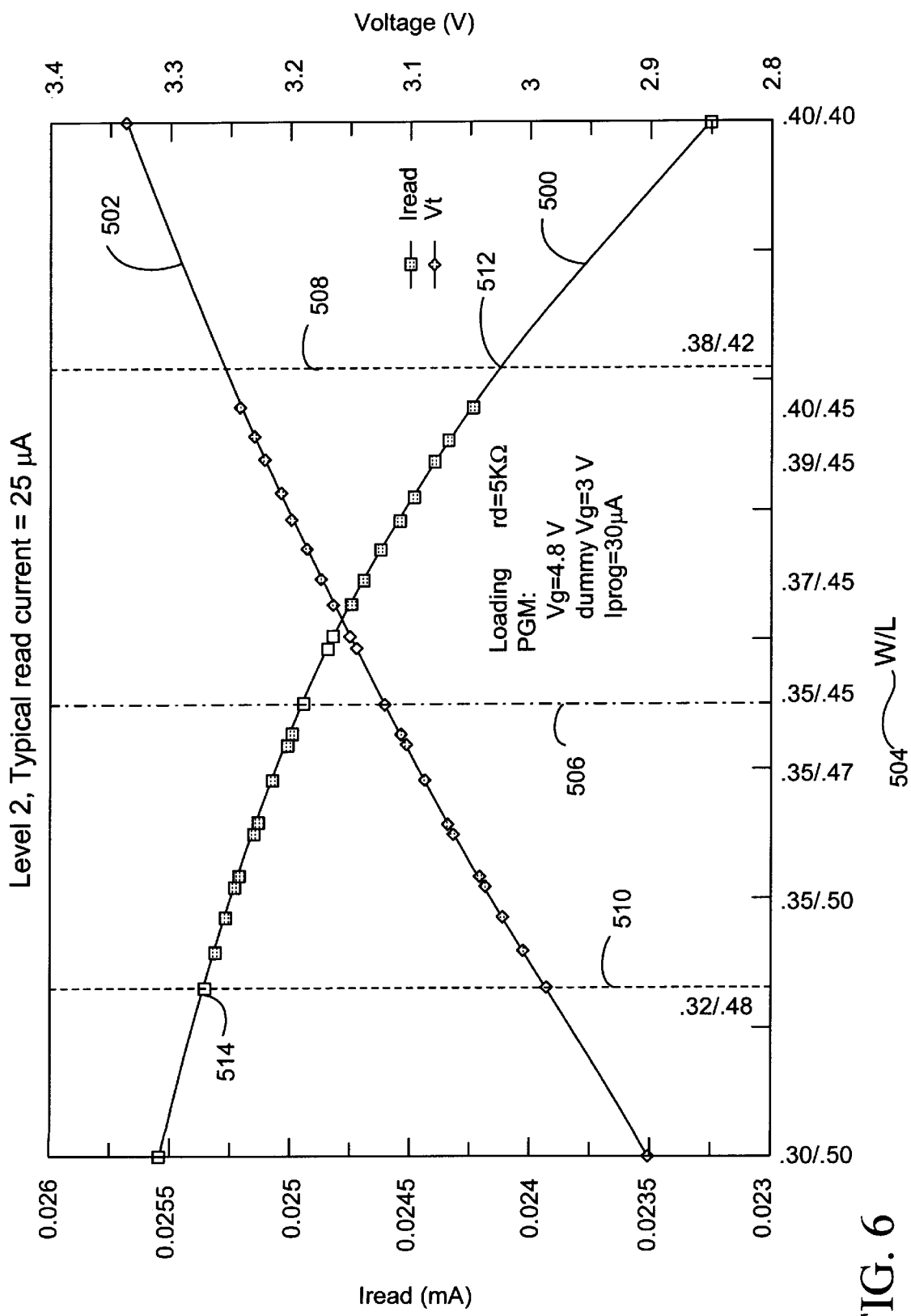
FIG. 6 is a plot showing the effect of process variations on the read current for level 2 voltages.
Figure 7:
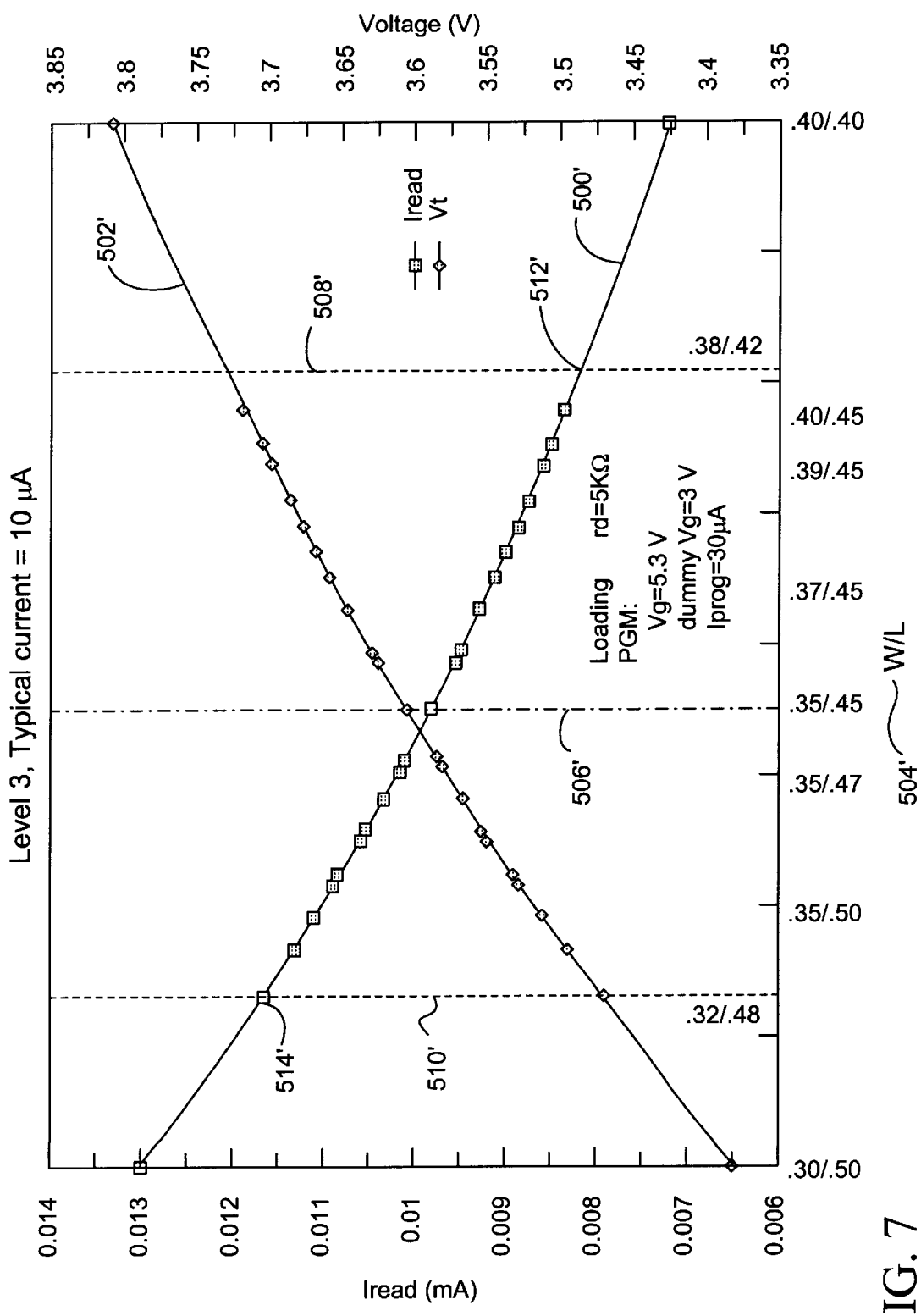
FIG. 7 is a plot showing the effect of process variations on the read current for level 3 voltages.

Another advantage of the proposed memory cell device configuration and self-converged programming method includes minimization of possible effects of process variations. In general, process variations are minimized because the dummy array is formed near to, and under the same processing constraints as, the memory array. In addition, the same wordline of the memory array and dummy array are selected during programming and read operations, instead of the prior method of comparing all of the memory cells to a fixed voltage. Referring now to FIG. 6, a plot is shown of the read current (Iread) 500 and the threshold voltage (Vt) 502 versus different width and length (W/L) combinations 504 for the formed device. A typical formed cell might have a physical W/L combination equal to 0.35/0.45 micrometers (um) as shown by line 506 on the plot. If the process variations for the same wordlines of memory cells and dummy cells can be controlled within 0.03 um for both channel width and channel length, e.g. W/L=0.38/0.42 as shown by line 508, and W/L=0.32/0.48 as shown by line 510, then the current distribution will be within 24 microamps (uA) to 26 uA for level 2. This distribution is shown respectively by points 512 and 514. Referring now to FIG. 7, a similar plot is shown for level 3 voltage levels. FIG. 7 uses prime element numbers (e.g. 500', 502') to describe the level 3 plot curves and reference lines. The current distribution will be 8 uA to 12 uA for level 3, as shown by respective points 512' and 514'. Such current distributions have been found sufficiently tight and robust to provide improved multi-level programming.

Still another advantage of the proposed memory cell device configuration and self-converged programming method is that variations of the wordline voltage are allowable. In conventional programming methods involving, for example, two or three programming steps, the variation of wordline voltage has a strong impact on the final programmed level. A practical reality is that the wordline voltage may vary as the power supply voltage changes. However, according to the configuration of the present invention, the converged voltage is dependant on the threshold voltage of the dummy cell, and is independent of the wordline voltage which may varying as the power supply voltage changes. Therefore, a variation on the wordline voltage is allowable during programming. Note that during read operations, the read current is strongly dependant on the wordline voltage also. Under the present invention, the same wordline voltage is applied to both the memory cell and the dummy cell. Hence any increased or decreased levels of the memory cell and dummy cell which are due to a power supply variation end up being almost the same. Hence, a variation of wordline voltage is allowable during read operations.

Yet another advantage of the proposed memory cell device configuration and self-converged programming method is that temperature effects can be tracked. As detailed above, the converged voltage of the memory cell is identical (under ideal conditions) to the threshold voltage of the dummy cell. Accordingly, the final converged voltage is independent of temperature if the threshold voltage of the dummy cell can be controlled by a stable voltage regulator. Moreover, considerations for different temperatures during programming and read operations can be deemed negligible as the dummy cells will track the temperature effect for both programming and read operations.

Figure 8:
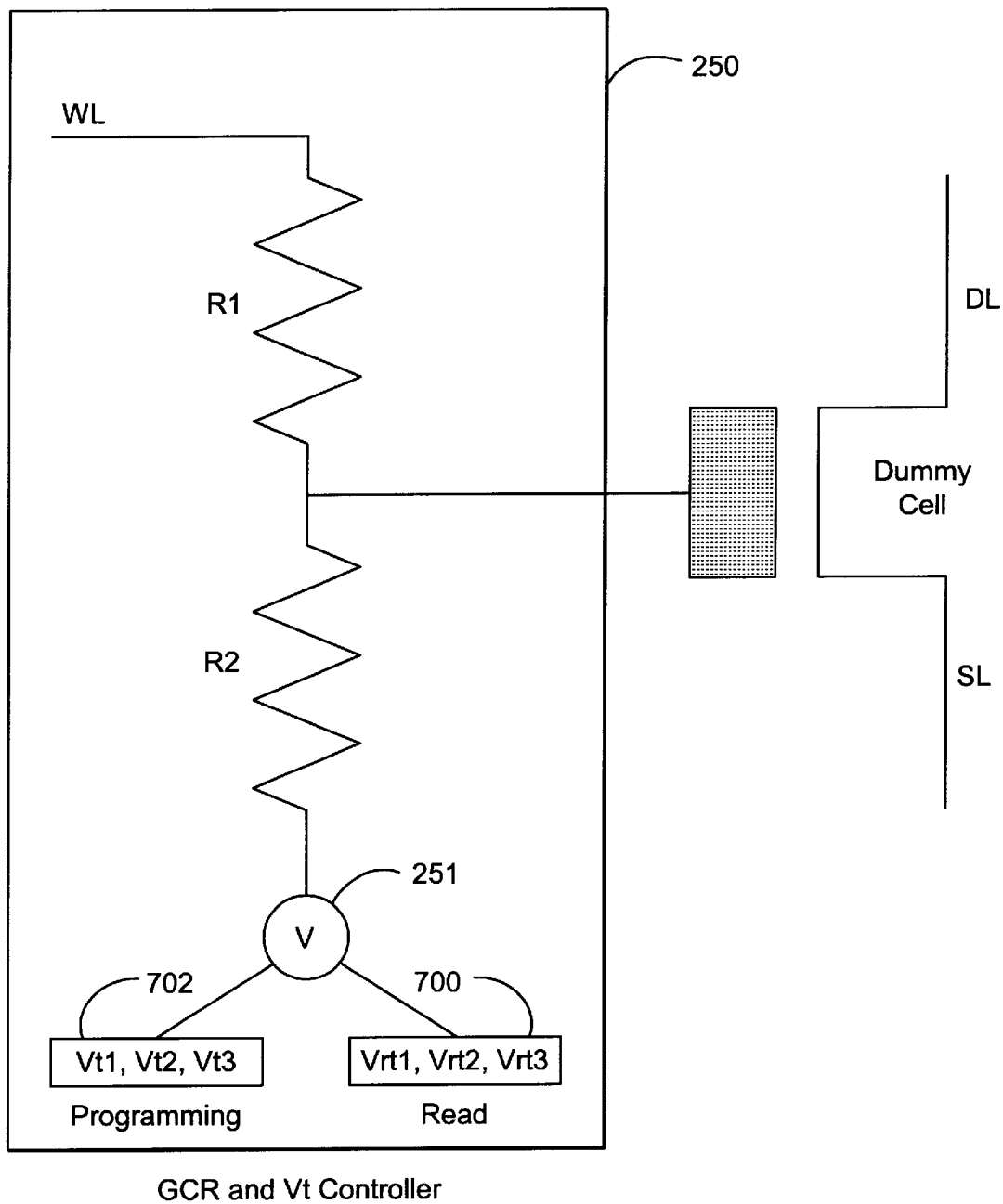
FIG. 8 is a diagram of the GCR and threshold voltage controller as used for adjustment of both programming and read voltages.

Yet another important consideration in multi-level cell programming is the need for an extra voltage margin to accurately perform read operations on the programmed memory cell. In order to gain such read margins, it is generally better to have the threshold voltages of the dummy cells be different during programming operations from the threshold voltages of the dummy cells during read operations. Referring now to FIG. 8, a different set of read threshold voltages 700 and programming threshold voltages 702 are shown applied through the voltage supply device 251 to the GCR and Vt Controller 250, as described above for FIG. 3(a). As such, the voltages Vt1, Vt2, and Vt3 are applied to the GCR and Vt controller 250 during programming operations. The threshold voltage of the memory cell is therefore converged to the adjusted voltages Vt1', Vt2', and Vt3'. However, during read operations the voltages Vrt1, Vrt2, and Vrt3 are applied to the GCR and Vt controller 250. The threshold voltage of the dummy cell during a read operation becomes Vrt1', Vrt2', and Vrt3' (as similar to the voltage adjustments resulting in FIG. 4). Hence, by so adjusting the read voltages, the read margin can be improved. The stability of voltages (Vt1, Vt2, Vt3, Vrt1, Vrt2, Vrt3) is important, and as mentioned above, it is preferable to generate these voltages from a stable voltage generator.

Still another method to gain sufficient read margin might similarly be used. Under this method, the voltage set Vt1, Vt2, and Vt3 would be applied to the GCR and Vt controller device for both programming and read operations. However, the read margin might be gained by using and applying the fact that the sensing ratio (or loading) is different for the memory array and dummy array during read operations.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A non-volatile, multiple level, self-converging programmable memory cell device comprising:

a floating gate memory cell having a source node coupled to a memory cell current source with a memory cell current source voltage;

a reference cell having a source node coupled to a reference cell current source with a reference cell current source voltage;

a comparator coupled to receive input signals from the memory cell current source voltage and the reference cell current source voltage, the comparator producing a signal representing the difference between the input signals; and a program controller for applying programming signals to the memory and reference cell, the program controller responsive to the signal from the comparator.

2. A non-volatile, multiple level, self-converging programmable memory cell device comprising:

a floating gate memory cell having a node coupled to a memory cell current source with a memory cell current source voltage;

a reference cell having a node coupled to a reference cell current source with a reference cell current source voltage;

wherein the memory and reference cells each have a source node, a drain node, and a gate node, the memory and reference cell gate nodes are connected via a common wordline, the memory and reference cell drain nodes receive common inputs, and the memory and reference cell source nodes are coupled to the respective memory and reference cell current sources;

further including a comparator coupled to receive input signals from the memory cell current source voltage and the reference cell current source voltage, the comparator producing a signal representing the difference between the input signals; and a program controller for applying pro ramming signals to the memory and reference cell, the program controller responsive to the signal from the comparator.

3. A non-volatile, multiple level, self-converging programmable memory cell device comprising:
a floating gate memory cell having a node coupled to a memory cell current source with a memory cell current source voltage;
a reference cell having a node coupled to a reference cell current source with a reference cell current source voltage wherein the reference cell includes a floating gate memory cell with the control gate and floating gate coupled together;
a comparator coupled to receive input signals from the memory cell current source voltage and the reference cell current source voltage, the comparator producing a signal representing the difference between the input signals; and
a program controller for applying programming signals to the memory and reference cell, the program controller responsive to the signal from the comparator.

4. The non-volatile, multiple level, self-converging programmable memory cell device of claim 2, wherein the memory cell has a threshold voltage and the reference cell has a threshold voltage, and the memory cell threshold voltage will converge to the threshold voltage of the reference cell.

5. The non-volatile, multiple level, self-converging programmable memory cell device of claim 4, further comprising a voltage generator coupled to set the threshold voltage of the reference cell to one of the multiple levels, wherein the memory cell threshold voltage will converge to the threshold voltage set for the reference cell, and wherein the program controller will cease applying program signals when the signal from the comparator indicates convergence of the comparator input signals.

6. The non-volatile, multiple level, self-converging programmable memory cell device of claim 5, wherein the voltage generator is a stable voltage regulator including a bandgap reference voltage generator.

7. The non-volatile, multiple level, self-converging programmable memory cell device of claim 5, wherein the memory cell and reference cell are each comprised of a floating gate memory cell having a floating gate and a control gate with the gates resulting in a ratio of a first and second voltage, the first voltage being that which is applied to the control gate and the second voltage being that which results on the floating gate after programming of the cell, the memory cell device further comprising a circuit for adjusting the ratio so that the threshold voltage of the reference cell is substantially equal to the threshold voltage of the memory cell.

8. The non-volatile, multiple level, self-converging programmable memory cell device of claim 7, wherein the programmable memory cell undergoes program and read operations, the voltage generator being used to set threshold voltages for program operations.

9. The non-volatile, multiple level, self-converging programmable memory cell device of claim 7, wherein the programmable memory cell undergoes program and read operations, and the voltage generator being used to set threshold voltages for read operations.

10. A non-volatile, multiple level, self-converging programmable memory cell device comprising:
a floating gate memory cell, selectable from an array of memory cells, the memory cell having a drain, source and gate node;
a reference cell, selectable from an array of reference cells, the reference cell having a drain, source, and gate nodes, wherein the memory and reference cell gate nodes are coupled via a common wordline, and the memory and reference cell drain nodes are switchably coupled to a voltage input;
a comparator which receives input signals from the memory and reference cell source nodes and outputs a difference between the input signals; and
a program controller for applying programming inputs to the coupled memory and reference cells, the controller responsive to the output of the comparator.

11. The non-volatile, multiple level, self-converging programmable memory cell device of claim 10, wherein the source nodes of the memory and reference cells are coupled to the respective memory and reference cell current sources having memory and reference cell current source voltages, and the comparator receives input signals representing these voltages.

12. The non-volatile, multiple level, self-converging programmable memory cell device of claim 10, wherein the reference cell is a non-programmable device.

13. The non-volatile, multiple level, self-converging programmable memory cell device of claim 12, wherein the reference cell is a non-programmable device including a floating gate memory cell with the control gate and floating gate coupled together.

14. The non-volatile, multiple level, self-converging programmable memory cell device of claim 10, wherein the memory cell has a threshold voltage and the reference cell has a threshold voltage, and the memory cell threshold voltage will converge to the threshold voltage of the reference cell.

15. The non-volatile, multiple level, self-converging programmable memory cell device of claim 14, further comprising a voltage generator coupled to set the threshold voltage of the reference cell to one of the multiple levels, wherein the memory cell threshold voltage will converge to the threshold voltage set for the reference cell, and wherein the program controller will cease applying program signals when the output signal from the comparator indicates convergence of the comparator input signals.

16. The non-volatile, multiple level, self-converging programmable memory cell device of claim 15, wherein the voltage generator is a stable voltage regulator including a bandgap reference voltage generator.

17. The non-volatile, multiple level, self-converging programmable memory cell device of claim 14, wherein the memory cell and reference cell are each comprised of a floating gate memory cell having a floating gate and a control gate with the gates resulting in a ratio of a first and second voltage, the first voltage being that which is applied to the control gate and the second voltage being that which results at the floating gate after programming of the cell, the memory cell device further comprising a circuit for adjusting the ratio so that the threshold voltage of the reference cell is substantially equal to the threshold voltage of the memory cell.

18. The non-volatile, multiple level, self-converging programmable memory cell device of claim 17, wherein the programmable memory cell undergoes program and read operations, the voltage generator being used to set threshold voltages for program operations.

19. The non-volatile, multiple level, self-converging programmable memory cell device of claim 17, wherein the programmable memory cell undergoes program and read operations, and the voltage generator being used to set threshold voltages for read operations.

20. A method for multiple level, self-converged programming of a memory cell device including a floating gate memory cell having a threshold voltage and source node with a current source voltage, a non-programmable reference cell having a threshold voltage and source node with a current source voltage, a comparator with at least two inputs and one output, the method comprising the steps of:

setting a threshold voltage for the reference cell;

undergoing programming steps to program the memory cell to a desired level corresponding to the threshold voltage;

comparing the memory cell current source voltage and the reference cell current source voltage by inputting the signals into the comparator, wherein the memory cell source voltage will converge to the level of the reference cell source voltage;

using the output of the comparator to provide program control signals which cease programming operations.

21. The method of claim 20, wherein a voltage supply source is further provided for applying the step of setting the threshold voltage of the reference cell.

22. The method of claim 21, further including the step of adjusting the threshold voltage of the reference cell to compensate for gate coupling ratio differences between the memory and reference cells.

23. The method of claim 20, wherein the memory and reference cell are part of respective arrays of switchably selectable cells, and the method further includes the step of switchably selecting the memory cell to program, along with the corresponding reference cell.

24. The method of claim 23, wherein the memory and reference cell share the same wordline.

25. A non-volatile, multiple level, self-converging programmable memory cell device comprising:

a floating gate memory cell having a node coupled to a memory cell current source with a memory cell current source voltage;

a reference cell having a node coupled to a reference cell current source with a reference cell current source voltage;

a comparator coupled to receive input signals from the memory cell current source voltage and the reference cell current source voltage, the comparator producing a signal representing the difference between the input signals; and a program controller for applying programming signals to the memory and reference cell, the program controller responsive to the signal from the comparator wherein the memory cell has a threshold voltage and the reference cell has a threshold voltage, and the memory cell threshold voltage will converge to the threshold voltage of the reference cell.

* * * * *